(12) United States Patent
Ok et al.

(10) Patent No.: US 10,950,464 B2
(45) Date of Patent: Mar. 16, 2021

(54) ELECTRONIC DEVICE MODULE AND MANUFACTURING METHOD THEREOF

(71) Applicant: SAMSUNG ELECTRO-MECHANICS CO., LTD., Suwon-si (KR)

(72) Inventors: Chang Ho Ok, Suwon-si (KR); Min Ryeol Eom, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 22 days.

(21) Appl. No.: 16/437,410

(22) Filed: Jun. 11, 2019

(65) Prior Publication Data

US 2020/0286746 A1    Sep. 10, 2020

(30) Foreign Application Priority Data

Mar. 6, 2019    (KR) .................... 10-2019-0025947

(51) Int. Cl.
*H01L 21/48* (2006.01)
*H01L 23/498* (2006.01)
*H01L 23/00* (2006.01)

(52) U.S. Cl.
CPC .... *H01L 21/4867* (2013.01); *H01L 23/49811* (2013.01); *H01L 24/32* (2013.01); *H01L 24/83* (2013.01); *H01L 2224/32227* (2013.01); *H01L 2224/83815* (2013.01)

(58) Field of Classification Search
CPC ..... H01L 21/4867; H01L 24/32; H01L 24/83; H01L 23/49811; H01L 2224/83815; H01L 2224/32227; H01L 23/49816

USPC .................... 257/783, 786; 438/118, 612
See application file for complete search history.

(56) References Cited

U.S. PATENT DOCUMENTS 20,130,135  *  5/2013  Kim et al. ............ H01L 23/467
                                                                    361/967
2014/0313682 A1    10/2014  Mitome

FOREIGN PATENT DOCUMENTS

| JP | 5213074 B2 | 6/2013 |
| JP | 2014-212276 A | 11/2014 |
| JP | 2018-006465 A | 1/2018 |
| KR | 10-2013-0009441 A | 1/2013 |

OTHER PUBLICATIONS

KIPO English translation of Korean Patent KR 10-2013-0009441 A Author: Jin et al. title semiconductor substrate , Date Jan. 23, 2013 pp. 1-17 (Year: 2013).*

* cited by examiner

*Primary Examiner* — Thinh T Nguyen
(74) *Attorney, Agent, or Firm* — NSIP Law

(57) ABSTRACT

An electronic device module includes a substrate having a ground region including ground pads spaced apart from each other, an electronic device mounted on the substrate and including a ground terminal bonded to the ground region, and a conductive adhesive bonding the ground pads and the ground terminal together, wherein an upper surface of the conductive adhesive includes a bonding surface bonded to the ground terminal, and a lower surface of the conductive adhesive includes bonding surfaces bonded to each of the ground pads, and an air path provided between the ground pads, through which gas generated in a process of mounting the electronic device on the substrate is discharged.

5 Claims, 6 Drawing Sheets

ELECTRONIC DEVICE MODULE AND MANUFACTURING METHOD THEREOF

CROSS-REFERENCE TO RELATED APPLICATIONS

This application claims the benefit under 35 USC 119(a) of Korean Patent Application No. 10-2019-0025947 filed on Mar. 6, 2019 in the Korean Intellectual Property Office, the entire disclosure of which is incorporated by reference for all purposes.

BACKGROUND

1. Field

The following description relates to an electronic device module. The following description also relates to a manufacturing method of such an electronic device module.

2. Description of Related Art

A conductive paste such as a solder paste may be melted. Additionally, a flux, or the like, contained in the paste, may be vaporized to generate gas.

Therefore, when an electric device is bonded to a circuit board provided with a pad having a large area in a soldering process, in a process of melting and curing a solder paste applied to the pad having a large area, gas may not be smoothly discharged and may be easily trapped in the bonding process. As a result, voids may exist inside a cured conductor.

Even when the module on which the electronic device is mounted includes the void, voids, or the like, it may operate normally in an initial stage of its operations. However, when physical or environmental stresses, such as hygroscopicity, for example, excessive moisture, thermal impacts, or the like, are applied repetitively, a problem such as breakage of a joint portion, or a similar physical breakdown, may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate including a ground region including ground pads spaced apart from each other, an electronic device mounted on the substrate and including a ground terminal bonded to the ground region, and a conductive adhesive bonding the ground pads and the ground terminal together, wherein an upper surface of the conductive adhesive includes a bonding surface bonded to the ground terminal, and a lower surface of the conductive adhesive includes bonding surfaces bonded to each of the ground pads, and an air path provided between the ground pads, through which gas generated during a process of mounting the electronic device on the substrate is discharged.

The substrate may further include a signal pad disposed around the ground region, and an area of each of the ground pads may fall in a range between one or more times of an area of the signal pad and two or fewer times of the area of the signal pad.

A total area of the ground pads may be 50% or more of a total area of the ground region.

The ground pads may be nonsolder mask defined (NSMD) type pads.

In another general aspect, a manufacturing method of an electronic device module includes providing a substrate having a ground region separated from ground pads by an air path, applying a conductive paste to the ground region, disposing an electronic device on the conductive paste, and performing a reflow process to melt and cure the conductive paste, wherein the applying the conductive paste includes applying the conductive paste to application regions disposed to be spaced apart from each other, and at least a portion of each of the application regions is disposed outside of the ground pad.

At least a portion of the application regions may be disposed in the air path, or may be disposed outside of the ground region.

The applying the conductive paste may include disposing a printing mask having an opening on the substrate, and applying the conductive paste to the application regions through the opening.

The substrate may further include a signal pad disposed around the ground region and bonded to a signal terminal provided in the electronic device, wherein the application region may be disposed to be spaced apart from the signal pad by a distance of 200 µm or more.

The substrate may further include a signal pad disposed around the ground region and bonded to the signal terminal provided in the electronic device, and each of the application regions may be formed to have an area of 120% or less of an area of the signal pad.

A spacing distance between the application regions may be formed to be 100 µm or less.

At least one of the application regions may be disposed on the ground pads.

In another general aspect, a manufacturing method of an electronic device module may include providing a substrate having a ground region, applying a conductive paste to the ground region, disposing an electronic device on the conductive paste, and performing a reflow process to melt and cure the conductive paste, wherein the ground region includes ground pads, and the cured conductive paste includes an upper surface including a bonding surface bonded to the ground terminal of the electronic device, and a lower surface including bonding surfaces bonded to each of the ground pads.

The applying the conductive paste may include disposing a printing mask having openings disposed to be spaced apart on the substrate, and applying the conductive paste to the ground region through the opening.

The printing mask may be formed such that a spacing distance between the openings is formed to be 100 µm or less.

The substrate may further include a signal pad disposed around the ground region, and an area of each of the ground pads may be formed to be in a range of one or more times an area of the signal pad and two or fewer times the area of the signal pad.

The total area of the ground pads may be formed to be 50% or more of a total area of the ground region.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
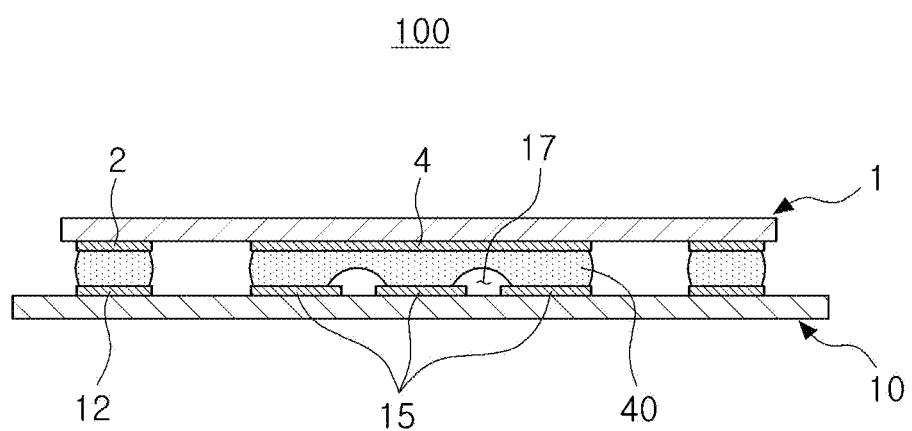
FIG. 1 is a schematic cross-sectional view of an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Hereinafter, embodiments of the present disclosure will be described as follows with reference to the attached drawings. The disclosure may, however, be exemplified in many different forms and should not be construed as being limited to the specific embodiments set forth herein, and those skilled in the art and understanding the present disclosure can easily accomplish retrogressive inventions or other embodiments included in the scope of the present disclosure by the addition, modification, and removal of components within the same scope, but those are construed as being included in the scope of the present disclosure.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

An aspect of the present disclosure is to provide an electronic device module and a manufacturing method thereof, capable of significantly reducing an influence on various defects which may occur in a soldering process.

Figure 2:
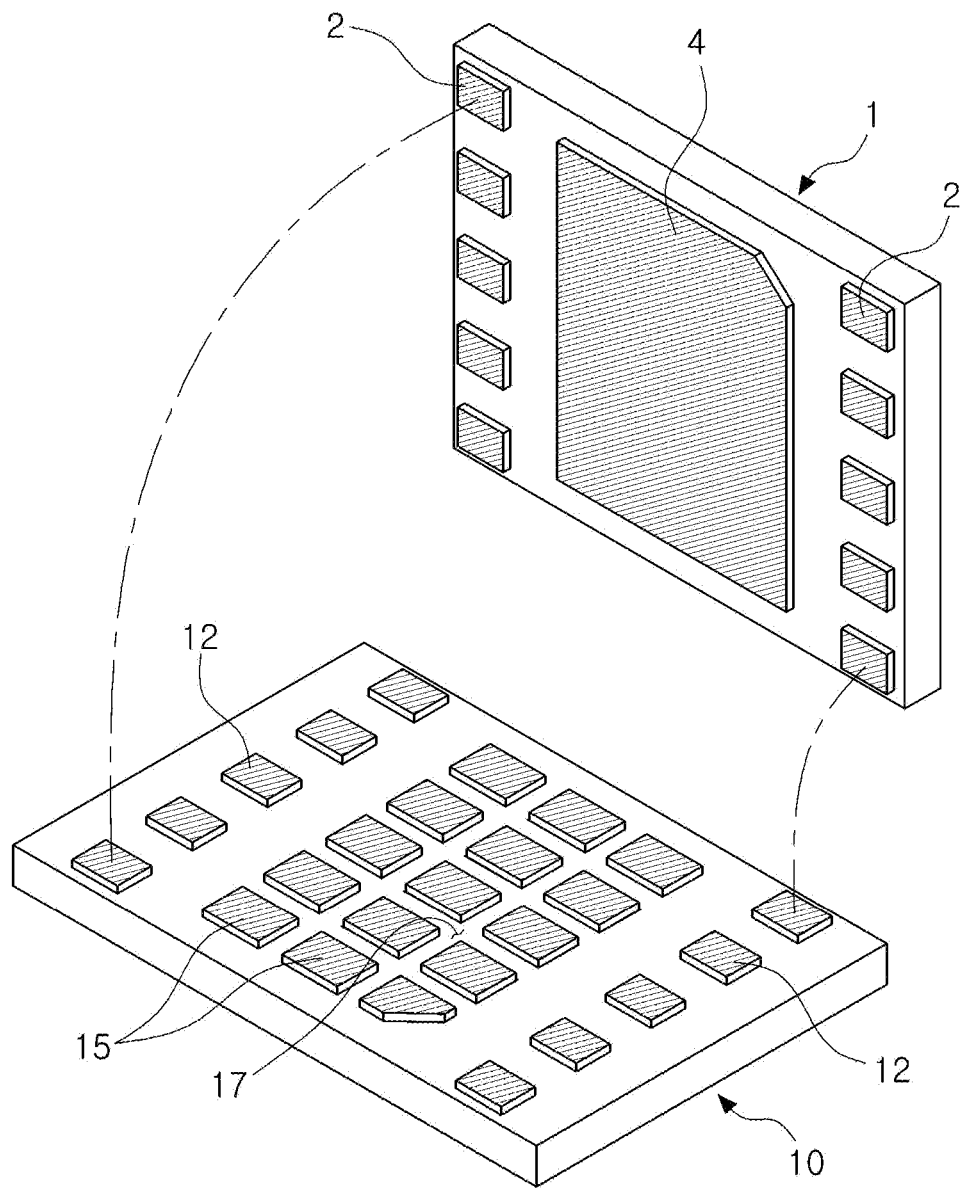
FIG. 2 is an exploded perspective view of the example of FIG. 1.
Figure 3:
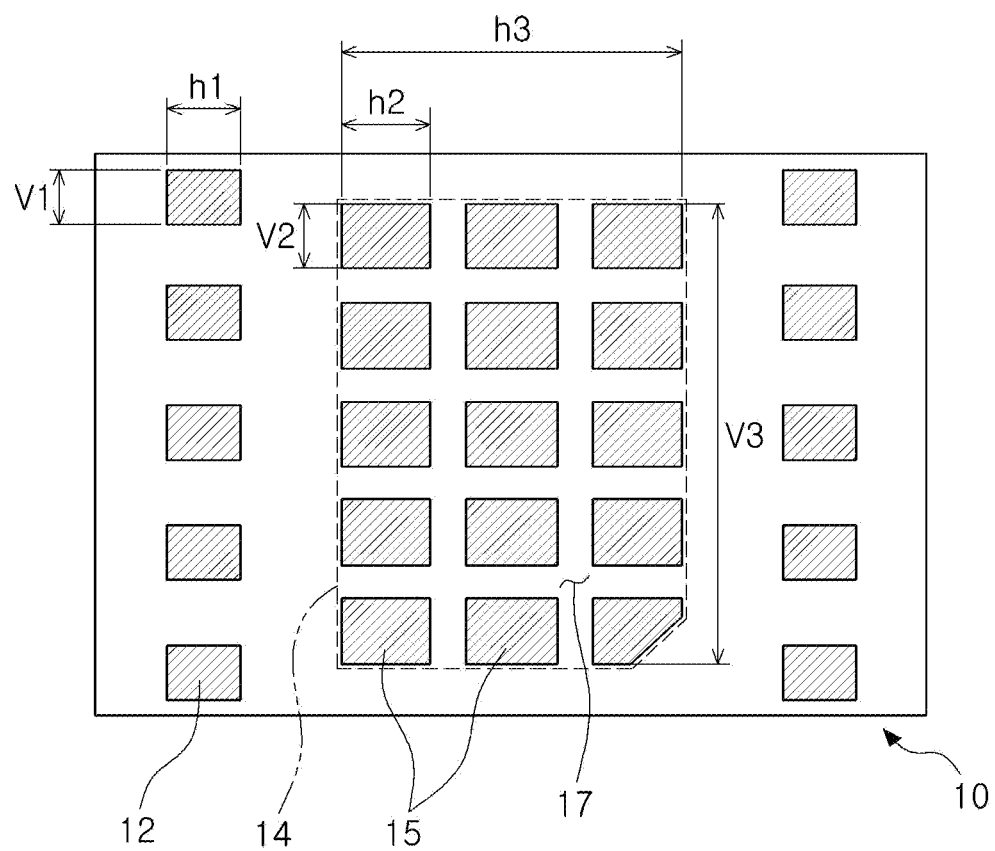
FIG. 3 is a plan view of the substrate illustrated in the example of FIG. 2.

FIG. 1 is a schematic cross-sectional view illustrating an electronic device module according to an example. FIG. 2 is an exploded perspective view of the example of FIG. 1. FIG. 3 is a plan view of the substrate illustrated in the example of FIG. 2.

Referring to the examples of FIGS. 1 to 3, a substrate 10 according to an example may be used to manufacture an electronic device module 100 by mounting an electronic device 1 above the substrate 10.

An electronic device 1 of the examples may include various devices such as an active device and a passive device, and any electronic components that may be mounted on a substrate may be used as the electronic device 1.

In the example of FIG. 1, the electronic device 1 may be a semiconductor chip, for example, a flat package device. In the present disclosure, the term "flat package device" may generally refer to an integrated circuit package chip, in which a top surface and a bottom surface form a flat plate and a lead terminal protrudes in parallel to the flat plate or a land is aligned on the bottom surface, unless specifically indicated to the contrary.

In the examples, the flat package device may include a package device having a pad having a large area. For example, packages such as a quad flat package (QFP), a quad flat no-lead semiconductor package (QFN), a micro leadframe package (MLF), a land grid array (LGA), and the like may be applied, but is not limited thereto, and other similar package devices may be used in other examples.

The electronic device 1 may include a signal terminal 2 and a ground terminal 4.

As illustrated in the example of FIG. 2, in the present example, the electronic device 1 may be configured such that the ground terminal 4 has a wider area than the signal terminal 2.

The signal terminal 2 may be connected to a signal pad 12 of a substrate 10 to transmit and receive a signal. Further, the ground terminal 4 may be connected to a ground pad 15 of the substrate 10 to extend a ground property.

The substrate 10 may be a substrate for surface mounting the electronic device 1, and may be formed of various types of substrates. For example, the substrate may be a printed circuit board (PCB), a flexible substrate, a ceramic substrate, a glass substrate, and the like, as is known in the art for substrates, though this is not meant to be limited of the materials that may be used for the substrate.

At least one electronic device 1 may be mounted on one surface of the substrate. Additionally, the substrate 10 may include the ground pad 15 and the signal pad 12 for this purpose.

Thus, the substrate 10 may be a multilayer substrate formed of a plurality of layers, and a circuit pattern for forming an electrical connection may be formed between each layer of the substrate 10.

A plurality of signal pads 12 and a plurality of ground pads 15 for mounting the electronic devices 1 may be disposed on one surface of the substrate 10.

The signal pad 12 may be disposed in a peripheral region of the ground pad 15 to be described later, and may be connected to the signal terminal 2 of the electronic device 1. Therefore, the signal pad 12 may be disposed in a region facing the signal terminal 2, when the electronic device 1 is mounted on the substrate 10.

The signal pad 12 may be formed of a conductive material, and may be formed, for example, of copper (Cu), though other appropriate conductive materials may be used in other examples.

In addition, the signal pad 12 and the ground pad 15 may be simultaneously manufactured on one surface of the substrate 10 through a photolithography method, or a similar manufacturing method.

The individual pads of signal pad 12 may be each used as a signal transmission path. Therefore, the size of the signal pad 12 may be formed to have a minimum size that may secure bonding reliability in order to smoothly transmit signals, and may also significantly reduce a mounting area of the electronic device 1.

The ground pad 15 may be formed by exposing a wiring or a pad having a ground property formed on the substrate 10. The ground pad 15 may also be electrically connected to the ground terminal 4 of the electronic device 1.

The ground pad 15 may be electrically connected to the ground terminal 4 disposed on the lower surface of the electronic device 1. Therefore, the ground pad 15 may be disposed in a region facing the ground terminal 4 when the electronic device 1 is mounted on the substrate 10.

The ground pad 15, according to the present example, may be formed in such a manner that a plurality of ground pads 15 are disposed so as to be spaced apart in the ground region 14. Thus, a space between the plurality of ground pads 15 may be used as an air path 17 through which gas generated in a soldering process is discharged. That is, the plurality of ground pads 15 may be partitioned by the air path 17, and the air path 17 may facilitate gas circulation.

Here, the ground region 14 may be a whole region in which the ground pads 15 are disposed, and may refer to a region configured by the ground pad 15 and the air path 17.

Referring to the example of FIG. 3, the air path 17 may be located between the ground pads 15 such that the ground pads 15 are disposed in a lattice form in the ground region 14. Accordingly, because the plurality of ground pads 15 may be disposed to be spaced apart at regular intervals in horizontal and vertical directions in such an example, the gas generated in the soldering process may be easily discharged to an outside of the ground region 14 through the air path 17, even at a central portion of the ground region 14.

The substrate 10 according to the present example may be the substrate 10 on which a nonsolder mask defined (NSMD)-type pad is formed. The NSMD method is a method in which a solder resist is disposed so as not to cover a portion of pads.

Because the pads of the ground pad 15 may be composed of an NSMD-type pad, an empty space may be provided between the ground pads 15. Therefore, the space may be used as the air path 17, in such an example.

When an excessive number of air paths 17 are disposed, or the air path 17 is formed to have an excessively wide width, a region in which the ground pad 15 is disposed may be reduced, relatively speaking. In this example, an actual bonding area may be reduced such that bonding reliability may be rather deteriorated as a result. Therefore, in some examples, the sum of the areas of respective ground pads 15 may be set to be 50% or more of the total area of the ground region 14. However, the examples are not limited thereto, and other examples may have the sum of the areas of respective ground pads 15 is set to be less than 50% of the total area of the ground region 14.

The number of the divided ground pads 15 may be changed according to the size of the ground terminal 4 of the electronic device 1 mounted on the substrate 10, or the size of the ground region 14 of the substrate 10 corresponding to the size of the ground terminal 4. In the case of the present example, the signal pad 12 may be formed to have a size of approximately 180 μm in width (h1) and 150 μm in height (v1). Also, the ground region 14 may be formed to have a size of 1040 µm in width (h3) and 1400 µm in height (v3) in total.

In this example, the ground pad 15 may be divided into 15 pads, and each of the divided ground pads 15 may have a size of approximately 260 µm in width and 190 µm in height (v2). In addition, as illustrated in FIGS. 2 and 3, at least one of the ground pads 15 may be configured differently in a size and a shape.

As described above, the signal pad 12 may be formed to have a minimum size that can secure signal transmission and bonding reliability. Therefore, the plurality of divided ground pads 15 may also be configured to be equal to the area of the signal pad 12, or alternatively to have an area larger than that of the signal pad 12.

In addition, when the area of each divided ground pads 15 is formed to be two or more times the area of the signal pad 12, a void in a solder may be increased during a soldering process. Therefore, in the present example, each of the ground pads 15 may be formed in a range of two times or less than the area of the signal pad 12.

The ground pad 15 may be formed of a conductive material in the same manner as the signal pad 12. Accordingly, the ground pad 15 may be formed of, for example, copper (Cu), though the ground pad 15 may be formed of other conductive materials in other examples.

In addition, the air path 17 may be formed by partially removing a metal layer forming the ground pad 15 during the process of manufacturing the ground pad 15. In this example, the removal of the metal layer may be performed by using etching, such as photolithography, by laser drilling, or by a similar approach that removes the metal layer 17 in keeping with the structures discussed, above.

Because the air path 17 is located between the ground pads 15, the depth of the air path 17 may be configured to be equal to the thickness of the ground pad. In addition, in the present example, the width of the air path 17 may be configured to be 100 µm. However, the examples are not limited thereto. The width of the air path 17 may be configured to have various depths, as long as an upper surface of a conductive adhesive 40 is able to be composed of one bonding surface.

The electronic device module 100 according to the present example configured as described above may be composed of one bonding surface, in which the upper surface of the conductive adhesive is bonded to the ground terminal. A lower surface of the electronic device module 100 may be composed of a plurality of bonding surfaces bonded to each of the ground pads. Accordingly, an empty space may be provided between the ground pads. The empty space may be used as an air path through which gas generated in the process of mounting the electronic device on the substrate is discharged in a manner that avoids having the gas be trapped.

Next, a manufacturing method of an electronic device module using the above-described substrate 10 is described, further.

Figure 4:
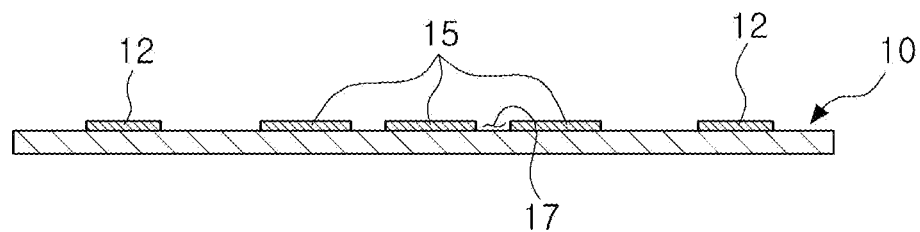
FIG. 4 is a view illustrating the manufacturing method of an electronic device module illustrated in the example of FIG. 1.
Figure 4:
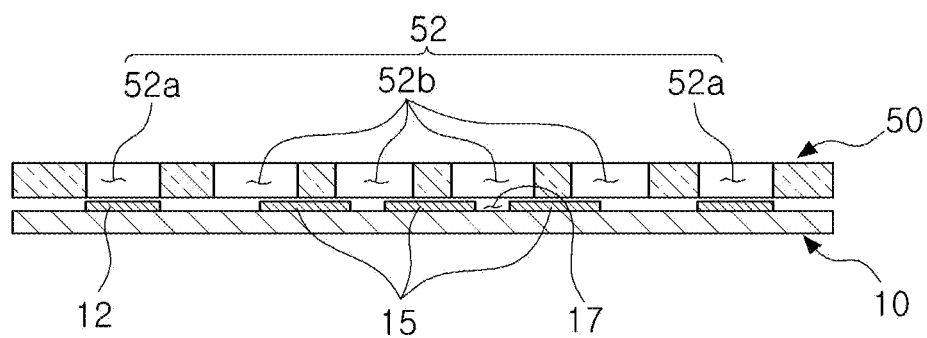
Figure 4:
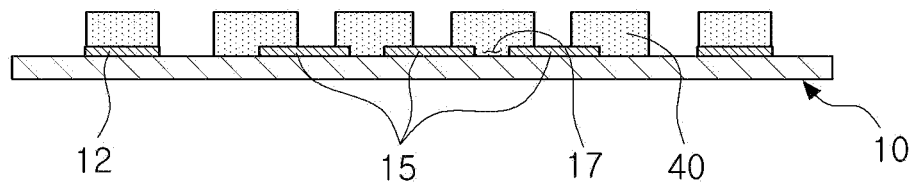
Figure 4:
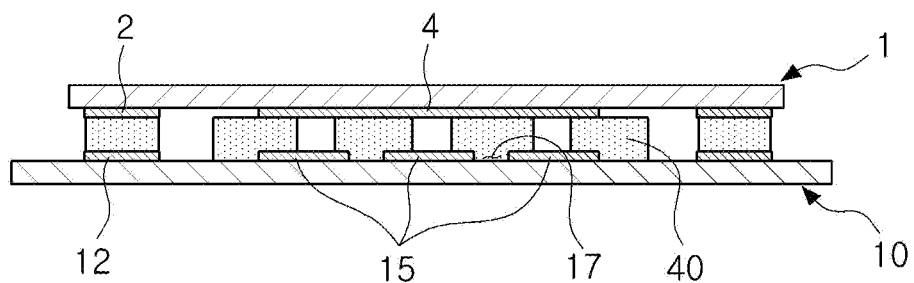
Figure 4:
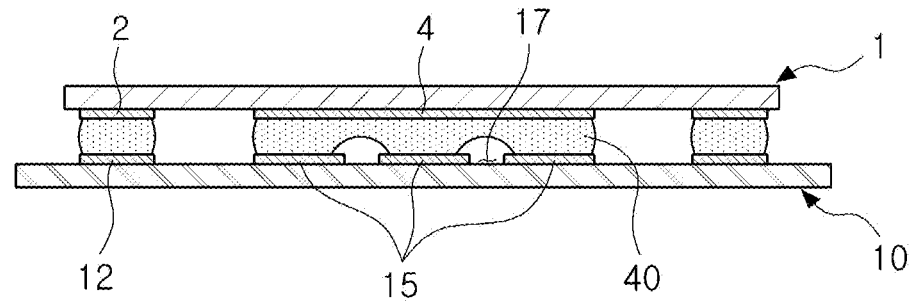

FIG. 4 is a view illustrating a manufacturing method of the electronic device module illustrated in the example of FIG. 1.

The manufacturing method of the electronic device module 1 of the present example may be provided with the substrate 10 illustrated in the example of FIG. 3. As described above, the substrate 10 of the present example may be provided with a ground region formed by the ground pad 15 and the air path 17. An initial operation in such a manufacturing method is shown in FIG. 4 at (a).

Next, as illustrated in the example of FIG. 4 at (b), a printing mask 50 may be disposed on the substrate 10.

The printing mask 50 may be provided with an opening 52 in a position corresponding to the signal pad 12 and the ground region 14. Accordingly, the opening 52 may be used as a path through which the conductive adhesive 40, in a form of a paste, is inserted and applied to the substrate 10.

An opening 52a, hereinafter, referred to as an opening for a signal, disposed on the signal pad 12, may be disposed in a position facing the signal pad 12, when the printing mask 50 is disposed on the substrate 10. In addition, the opening for the signal 52a may be formed to have the same size as the signal pad 12, or alternatively may be formed to have a size of 80% or more of the signal pad 12.

Accordingly, all of the conductive adhesives 40 may be applied only on the signal pad 12 at a later time, and may not be applied to an external region of the signal pad 12. However, the examples are not limited to such a configuration of the conductive adhesives 40, and the conductive adhesive 40 may be partially applied to the outside of the signal pad 12 as required, in other examples.

A plurality of openings 52b, hereinafter, an opening for a ground, may be disposed to be spaced apart from one another in the ground region 14.

At least a portion of the opening for the ground 52b may be located on the ground pad 15, when the printing mask 50 is disposed on the substrate 10. Further, at least the portion of the opening for the ground may be disposed to be located in the outside of the air path 17 or the ground region 14 of FIG. 3.

Figure 5:
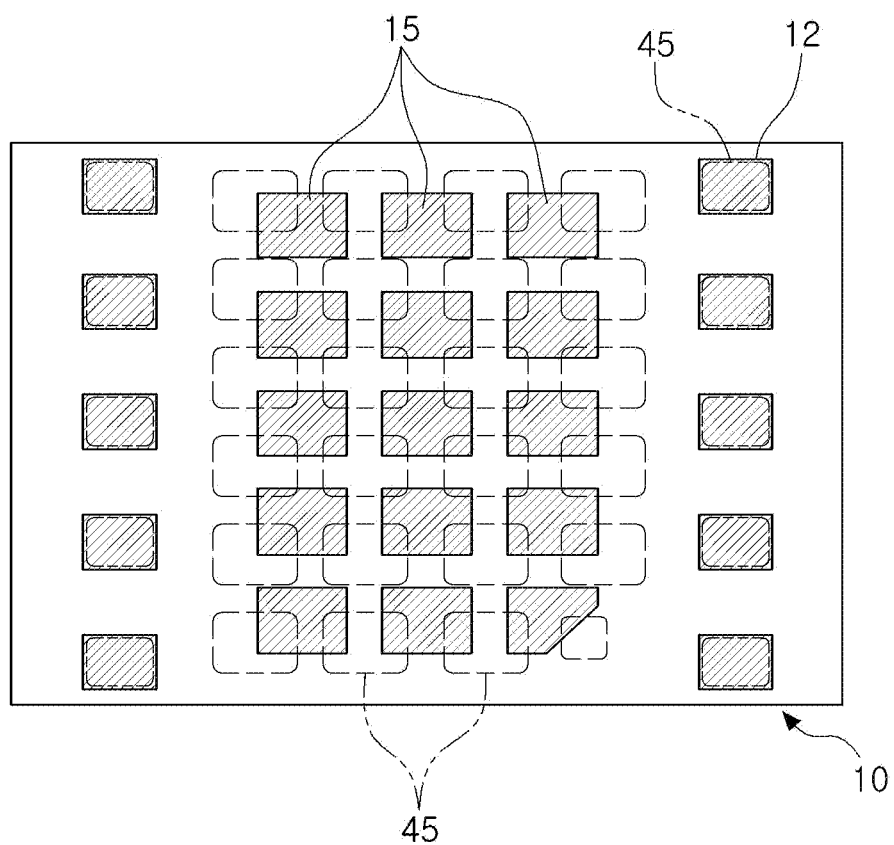
FIG. 5 is a plan view illustrating an application region of a conductive paste.

FIG. 5 is a plan view illustrating an application region of the conductive paste, and the application region of the example of FIG. 5 may refer to a position in which the conductive paste is applied to the substrate through the opening 52 of the printing mask 50. Therefore, when the printing mask 50 is disposed on the substrate 10, it may be understood that the position of the opening 52 is the same as an application region 45 of the example of FIG. 5.

Referring to the example of FIG. 5 together with the other drawings, the opening for a ground 52b disposed at an edge may be disposed such that a portion, such as approximately half, of the opening for the ground 52b is located on the ground pad 15, and a remaining portion of the opening for the ground 52b is located on an outside of the ground region 14. The opening for the ground 52b disposed inside the ground region 14 may be disposed such that at least a portion of the opening for the ground 52b is disposed on the air path 17, and a remaining portion of the opening for the ground 52b is located on one or a plurality of the ground pads 15.

In the present example, the openings for the ground 52b may be disposed in a lattice shape disposed to be spaced apart at regular intervals in a horizontal direction and a vertical direction.

In addition, the openings 52b for the ground may be configured differently on the area disposed on the ground pad 15, and one opening 52b the for ground may be disposed on one or a plurality of ground pads 15.

Then, as illustrated in operation (c) of FIG. 4, the conductive adhesive 40 may be applied. In operation (c), a conductive paste, such as a solder paste, may be used as the conductive adhesive 40. However, other appropriate conductive pastes may also be used as the conductive adhesive 40.

Because the conductive paste is applied through the printing mask 50, the conductive paste may be applied only to the region corresponding to the opening 52 of the printing mask 50. Therefore, the conductive paste may be applied only on the signal pad 12, in the region in which the signal pad 12 is disposed.

At least a portion of the conductive paste may be applied on the ground pad 15, and a remaining portion of the conductive paste may be applied on the air path 17 or may be applied to the outside of the ground pad 15 in the ground region 14.

In addition, as illustrated in the example of FIG. 5, the region to which the conductive paste is applied in the ground region 14 may be composed of a plurality of regions disposed to be spaced apart from each other, hereinafter, referred to as application regions, and the plurality of application regions 45 may be disposed in a lattice shape.

Each of the application regions 45 may be formed to have the same shape in some examples, but may be formed in different shapes from each other as required in other examples. In addition, the application regions 45 may be configured differently in an area disposed on the ground pad 15, and one application region 45 may be disposed on one or a plurality of ground regions 14.

When the application regions 45 disposed in the ground region 14 of FIG. 3 are excessively spaced apart, the areas of conductive adhesive 40 may not be connected to each other in a reflow process, to be described later. As a result of a test, if the test confirms that when a spacing distance between the application regions 45 exceeds 100 μm, the example in which the areas of conductive adhesive 40 are not connected to each other in the reflow process, to be described further, later, and as described above, may occur.

Therefore, in the present example, the spacing distance between the application regions 45 may be configured to be 100 μm or less. This characteristic may mean that the spacing distance between the openings for the ground 52b may be configured to be less than 100 μm in the printing mask 50.

In addition, when a total application area summing up the areas of respective application regions 45 is excessively smaller than the area of the ground region 14, the amount of the conductive adhesive 40 may be insufficient, and bonding reliability may be accordingly reduced. As a result of such a test, the test confirmed that the bonding reliability may be reduced when the total area of the application region 45 is 40% or less of the total area of the ground region 14.

Therefore, in the present example, the total area of the above-described application region 45 may accordingly be 41% or more of the total area of the ground region 14.

In addition, when the conductive adhesive 40 is applied in an excessively large amount, unevenness in the amount of the conductive adhesive 40 applied to each of the application regions 45 may occur. Accordingly, the electronic device 1, placed on the conductive paste, may be placed in a tilted state without being parallel to the substrate 10.

As a result of the test described further, above, the test confirmed that the above-described problem does not occur when the application regions 45 has an area of the application region 45 that is an area of 120% or less of the area of the signal pad 12. Therefore, in the present example, each of the application regions 45 may be formed to have an area of 120% or less of the area of the signal pad 12.

Meanwhile, in the present example, the application region 45 may be also disposed outside the ground region 14, such that the application region 45 may be disposed very close to the signal pad 12.

In this example, during the reflow process, the conductive adhesive 40 of the ground region 14 and the conductive adhesive 40 of the signal pad 12 may be connected to each other, such that a short-circuit may occur. As a result of the test, the test confirmed that an example in which the portions of the conductive adhesive 40 are connected to each other in the reflow process may occur when a spacing distance between the application region 45 of the signal pad 12 and the ground region 14 is less than 200 μm.

Therefore, in the present example, the application region 45 may be disposed to be spaced apart from the signal pad 12 by a distance of 200 μm or more.

Restrictions on the application region 34, as described above, may be applied by adjusting dispositional positions of the openings for a ground 52b and the openings for a signal 52a in the printing mask 50.

Subsequently, as illustrated in the example of FIG. 4 at (d), the electronic device 1 may be placed on the substrate 10 and the reflow process may be performed to melt and cure the conductive paste. Thus, the conductive adhesive 40 of the shape illustrated in the example of FIG. 4 at (e) may be completed.

The conductive paste applied to each of the application regions 45 of the ground region 14 may be melted and a portion of the conductive paste disposed outside the air path 17 and the ground region 14 may be drawn toward the ground pad 15 by surface tension, or a similar phenomenon. Thus, a surface area of the molten conductive paste may be expanded and fluid flow may occur, such that the surface area of the molten conductive paste may be increased to be in contact with air, thereby accelerating the discharge of gas.

In addition, the gas discharged from the molten conductive paste may be smoothly discharged to the outside of the ground region 14 through the air path 17.

The molten conductive paste may be cured in the shape illustrated in the example of FIG. 5 while also discharging as much of the gas as possible to form the conductive adhesive 40.

Figure 6:
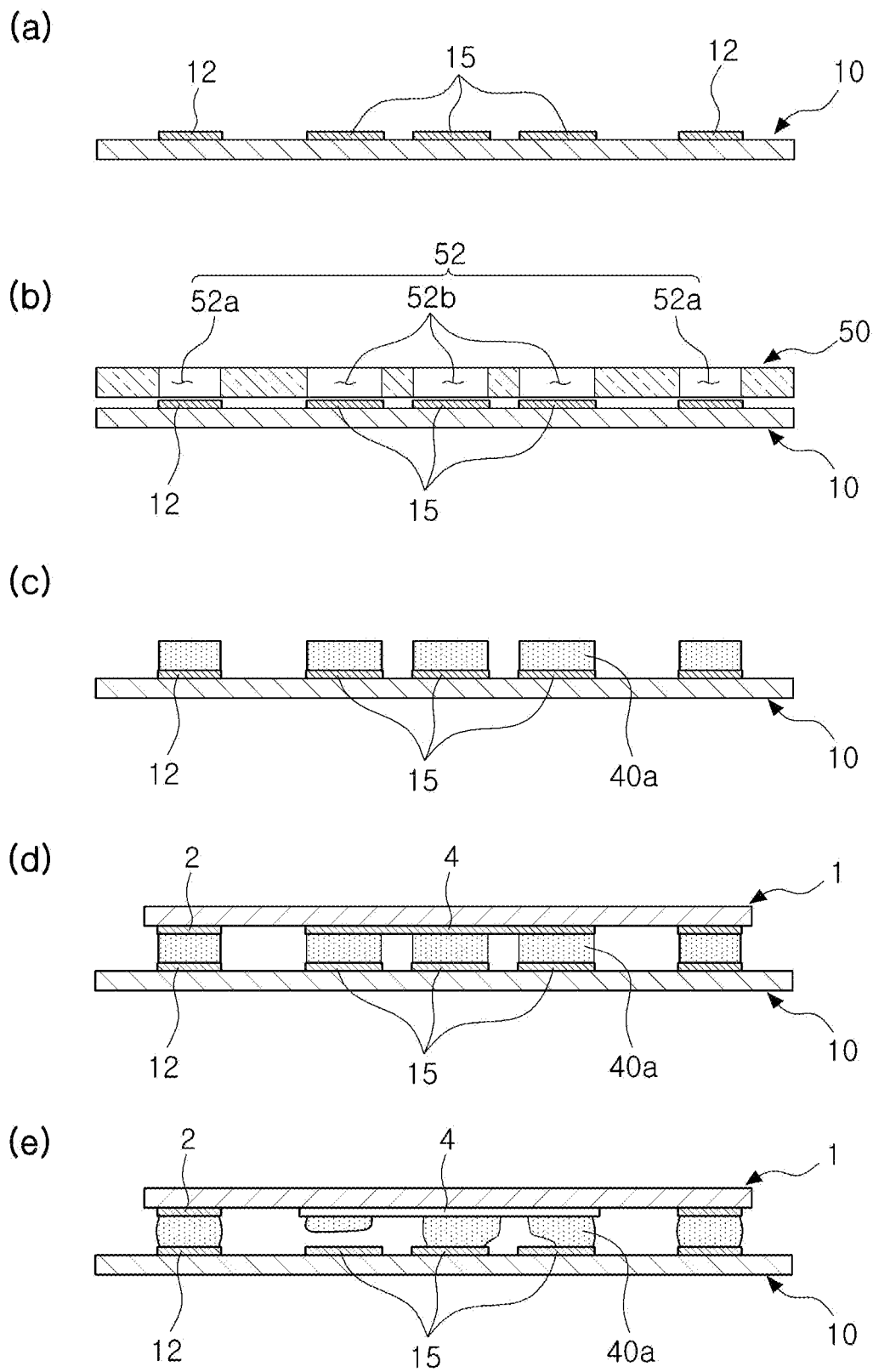
FIG. 6 is a view illustrating the comparative example of FIG. 4.

Meanwhile, the example of FIG. 6 is a view illustrating an alternative example that varies from FIG. 4, in which the conductive paste is applied only on the signal pad 12 and the ground pad 15, differing from the above-described example in accordance with FIG. 4.

Referring to the example of FIG. 6, a process up to the process illustrated in FIG. 6 at (d) may be performed similarly to the above-described example of FIG. 4. However, when a reliability test of the electronic device module is performed, after the reflow process is completed, a large void may be formed in a conductive adhesive 40a and may be separated from the conductive adhesive 40a, the ground pad 15, and so on, as illustrated in FIG. 6 at (e). Therefore, even when the ground pads of the ground region are separated into a plurality of ground pads, a defective junction may be somewhat increased, depending on the application method of the conductive paste.

By contrast, according to the manufacturing method according to the example illustrated in the example of FIG. 4, the upper surface of the conductive adhesive 40 may be entirely surface bonded to the ground terminal 4 of the electronic device 1. The lower surface of the conductive adhesive 40 may be surface bonded to each of the ground pads 15, and a region between the ground pads 15 may be left as an empty space to complete the air path 17.

In addition, because gas is efficiently discharged in such an example, void formation due to trapped gas may be significantly reduced. Therefore, bonding reliability may be increased.

As set forth above, when a terminal having a large area is bonded to a substrate, gas generated in a conductive paste during a soldering process may be smoothly discharged, thereby significantly reducing an influence of various defects which may occur in the soldering process. Therefore, bonding reliability between the electronic device and the substrate may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate comprising a ground region comprising ground pads spaced apart from each other;
   an electronic device mounted on the substrate and comprising a ground terminal bonded to the ground region; and
   a conductive adhesive bonding the ground pads and the ground terminal together,
   wherein an upper surface of the conductive adhesive comprises a single bonding surface bonded to the ground terminal, and a lower surface of the conductive adhesive comprises bonding surfaces bonded to each of the ground pads, and
   an air path provided between the ground pads, through which gas generated during a process of mounting the electronic device on the substrate is discharged.

2. The electronic device module of claim 1, wherein the substrate further comprises a signal pad disposed around the ground region, and
   an area of each of the ground pads falls in a range between one or more times of an area of the signal pad and two or fewer times of the area of the signal pad.

3. The electronic device module of claim 1, wherein a total area of the ground pads is 50% or more of a total area of the ground region.

4. The electronic device module of claim 1, wherein the ground pads are nonsolder mask defined (NSMD) type pads.

5. The electronic device module of claim 1, wherein an upper surface of the air path abuts a lower surface of the conductive adhesive.

* * * * *